United States Patent
Choi

(10) Patent No.: US 10,693,424 B2
(45) Date of Patent: Jun. 23, 2020

(54) POWER AMPLIFYING APPARATUS WITH WIDEBAND LINEARITY

(71) Applicant: SAMSUNG ELECTRO-MECHANICS CO., LTD., Suwon-si (KR)

(72) Inventor: Kyu Jin Choi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/146,170

(22) Filed: Sep. 28, 2018

(65) Prior Publication Data

US 2019/0199293 A1    Jun. 27, 2019

(30) Foreign Application Priority Data

Dec. 27, 2017    (KR) .......................... 10-2017-0181054

(51) Int. Cl.
*H03F 1/07* (2006.01)
*H03F 1/30* (2006.01)
(Continued)

(52) U.S. Cl.
CPC .............. *H03F 1/302* (2013.01); *H03F 1/32* (2013.01); *H03F 1/3223* (2013.01); *H03F 3/195* (2013.01);
(Continued)

(58) Field of Classification Search
CPC ................................ H03F 1/07; H03F 1/0288
(Continued)

(56) References Cited

U.S. PATENT DOCUMENTS 5,757,229 A * 5/1998 Mitzlaff ................ H03F 1/0261
330/124 R
7,518,448 B1 * 4/2009 Blair .................... H03F 1/0261
330/124 R
(Continued)

FOREIGN PATENT DOCUMENTS

KR    10-2009-0084843 A    8/2009
KR        10-1002893 B1    12/2010
(Continued)

OTHER PUBLICATIONS

Korean Office Action dated Feb. 25, 2019 in corresponding Korean Patent Application No. 10-2017-0181054 (7 pages in English, 6 pages in Korean).

(Continued)

*Primary Examiner* — Henry Choe
(74) *Attorney, Agent, or Firm* — NSIP Law

(57) ABSTRACT

A power amplifying apparatus includes a first bias circuit configured to generate a first bias current, a first amplification circuit, configured to receive the first bias current, amplify a signal input to the first amplification circuit through a first node, and output a first amplified signal to a second node, a second bias circuit, configured to generate a second bias current which has a magnitude different from a magnitude of the first bias current, and a second amplification circuit, connected in parallel with the first amplification, configured to receive the second bias current, amplify the signal input through the first node, and output a second amplified signal to the second node. The second amplification circuit is configured to output the second amplified signal with a third-harmonic component that has a phase offsetting a third-order intermodulation distortion (IM3) component included in the first amplified signal, based on the second bias current.

19 Claims, 8 Drawing Sheets

(51) Int. Cl.
*H03F 3/21* (2006.01)
*H03F 3/195* (2006.01)
*H03F 1/32* (2006.01)
*H03F 3/213* (2006.01)
*H03F 1/52* (2006.01)

(52) U.S. Cl.
CPC ............ *H03F 3/211* (2013.01); *H03F 3/213* (2013.01); *H03F 1/52* (2013.01); *H03F 2200/21* (2013.01); *H03F 2200/222* (2013.01); *H03F 2200/27* (2013.01); *H03F 2200/318* (2013.01); *H03F 2200/387* (2013.01); *H03F 2200/426* (2013.01); *H03F 2200/444* (2013.01); *H03F 2200/451* (2013.01); *H03F 2203/21103* (2013.01); *H03F 2203/21127* (2013.01); *H03F 2203/21139* (2013.01)

(58) Field of Classification Search
USPC .............................................. 330/124 R, 295
See application file for complete search history.

(56) References Cited

U.S. PATENT DOCUMENTS

| | | | | |
|---|---|---|---|---|
| 7,876,159 | B2* | 1/2011 | Wang | H03F 1/0288 330/124 R |
| 7,907,009 | B2* | 3/2011 | Mori | H03F 1/0277 330/124 R |
| 7,936,213 | B2* | 5/2011 | Shin | H03F 1/0288 330/124 R |
| 9,088,258 | B2* | 7/2015 | Ichitsubo | G06F 1/181 |
| 2007/0032208 | A1 | 2/2007 | Choi et al. | |
| 2010/0327969 | A1* | 12/2010 | Jung | H03F 1/0277 330/124 R |
| 2011/0260797 | A1* | 10/2011 | Lee | H03F 3/211 330/295 |
| 2013/0293311 | A1 | 11/2013 | Wakita et al. | |
| 2016/0049910 | A1 | 2/2016 | Datta et al. | |
| 2016/0134245 | A1 | 5/2016 | Won et al. | |

FOREIGN PATENT DOCUMENTS

| | | |
|---|---|---|
| KR | 10-2016-0020380 A | 2/2016 |
| KR | 10-2016-0055492 A | 5/2016 |
| WO | WO 2008/043098 A2 | 4/2008 |

OTHER PUBLICATIONS

Baek, Seungjun, et al. "A Linear InGaP/GaAs HBT Power Amplifier Using Parallel-Combined Transistors with IMD3 Cancellation", *IEEE Microwave and Wireless Components Letters*, Nov. 2016, vol. 26, No. 11, pp. 921-923 (3 pages in English).

* cited by examiner

< SW10 : OFF, SW20 : OFF >

POWER AMPLIFYING APPARATUS WITH WIDEBAND LINEARITY

CROSS-REFERENCE TO RELATED APPLICATIONS

This application claims the benefit under USC 119(a) of Korean Patent Application No. 10-2017-0181054 filed on Dec. 27, 2017, in the Korean Intellectual Property Office, the entire disclosure of which is incorporated herein by reference for all purposes.

BACKGROUND

1. Field

This application relates to a power amplifying apparatus with increased wideband linearity.

2. Description of Related Art

As the demand for wireless communication systems to be broadband capable, multimedia capable, and intelligent, gradually increases, the demand for radio frequency (RF) power amplifiers applied to the wireless communication systems to be broadband capable, have improvements in linearity, and to be intelligent increase.

Recently, it has become desirable for RF power amplifiers to linearly operate in a higher power region. Accordingly, linearity should be ensured for a wideband signal that includes a plurality of frequency bands without distortion.

In a typical RF power amplifier, however, when an interval between fundamental frequency signals of two or more different bands is narrow, since the fundamental frequency signal is adjacent to a third-order intermodulation distortion (hereinafter, referred to as IM3) component, a difference (hereinafter, referred to as IMD3) between the IM3 component and the fundamental frequency signal, and linearity may be decreased.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a power amplifying apparatus includes a first bias circuit configured to generate a first bias current, a first amplification circuit, configured to receive the first bias current, amplify a signal input to the first amplification circuit through a first node, and output a first amplified signal to a second node, a second bias circuit, configured to generate a second bias current which has a magnitude different from a magnitude of the first bias current, and a second amplification circuit, connected in parallel with the first amplification circuit, configured to receive the second bias current, amplify the signal input through the first node, and output a second amplified signal to the second node, wherein the second amplification circuit is configured to output the second amplified signal with a third-harmonic component that has a phase offsetting a third-order intermodulation distortion (IM3) component included in the first amplified signal, based on the second bias current.

The magnitude of the second bias current may be less than the magnitude of the first bias current.

The magnitude of the second bias current may be greater than the magnitude of the first bias current.

The first bias current may be a bias current of class AB, and the second bias current is a bias current of deep class AB between class AB and class B.

The magnitude of the second bias circuit may correspond to a magnitude of a fundamental frequency included in the input signal.

The second bias circuit may be varied through current sourcing or current sinking, according to an increase or a decrease of a fundamental frequency included in the input signal.

The second bias circuit may be configured to vary the second bias current corresponding to a varied magnitude of the fundamental frequency when a fundamental frequency included in the input signal is varied.

The second bias circuit may be a variable bias circuit.

In a general aspect, a power amplifying apparatus includes a drive bias circuit configured to generate a drive bias current, a drive amplification circuit configured to receive the drive bias current, amplify an input signal which has a first frequency component and a second frequency component, and output an amplified signal, a first bias circuit configured to generate a first bias current, a first amplification circuit configured to receive the first bias current, amplify a signal input to the first amplification circuit through a first node of the drive amplification circuit, and output a first amplified signal to a second node, a second bias circuit, configured to generate a second bias current which has a magnitude different from a magnitude of the first bias current, and a second amplification circuit, connected in parallel with the first amplification circuit, configured to receive the second bias current, amplify the signal input through the first node, and output a second amplified signal to the second node.

The magnitude of the second bias current may be less than the magnitude of the first bias current.

The magnitude of the second bias current may be greater than the magnitude of the first bias current.

The first bias current may be a bias current of class AB, and the second bias current is a bias current of deep class AB between class AB and class B.

The magnitude of the second bias circuit may correspond to a magnitude of a fundamental frequency included in the input signal.

The second bias circuit may be varied through current sourcing or current sinking, according to an increase or a decrease of a fundamental frequency included in the input signal.

The second bias circuit is configured to vary the second bias current corresponding to a varied magnitude of the fundamental frequency when a fundamental frequency included in the input signal is varied.

The second bias circuit may be a variable bias circuit.

In a general aspect, a power amplifying apparatus includes a first amplifier configured to generate a first amplified signal based on a received first bias current and an input signal comprising one or more frequency components, a variable bias circuit configured to generate a second bias current, and a second amplifier connected in parallel with the first amplifier, and configured to generate a second amplified signal based on a received second bias current from the variable bias circuit, and the input signal, wherein the second amplified signal has a third-harmonic component having a phase that offsets from a third-order intermodulation distortion (IM3) component in the first amplified signal.

The variable bias circuit may be configured to generate the second bias current to have a magnitude that is adjusted based on a magnitude of a fundamental frequency of the input signal, and transmit the second bias current to the second amplifier.

The variable bias circuit may be implemented as a current sink circuit or a current source circuit.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
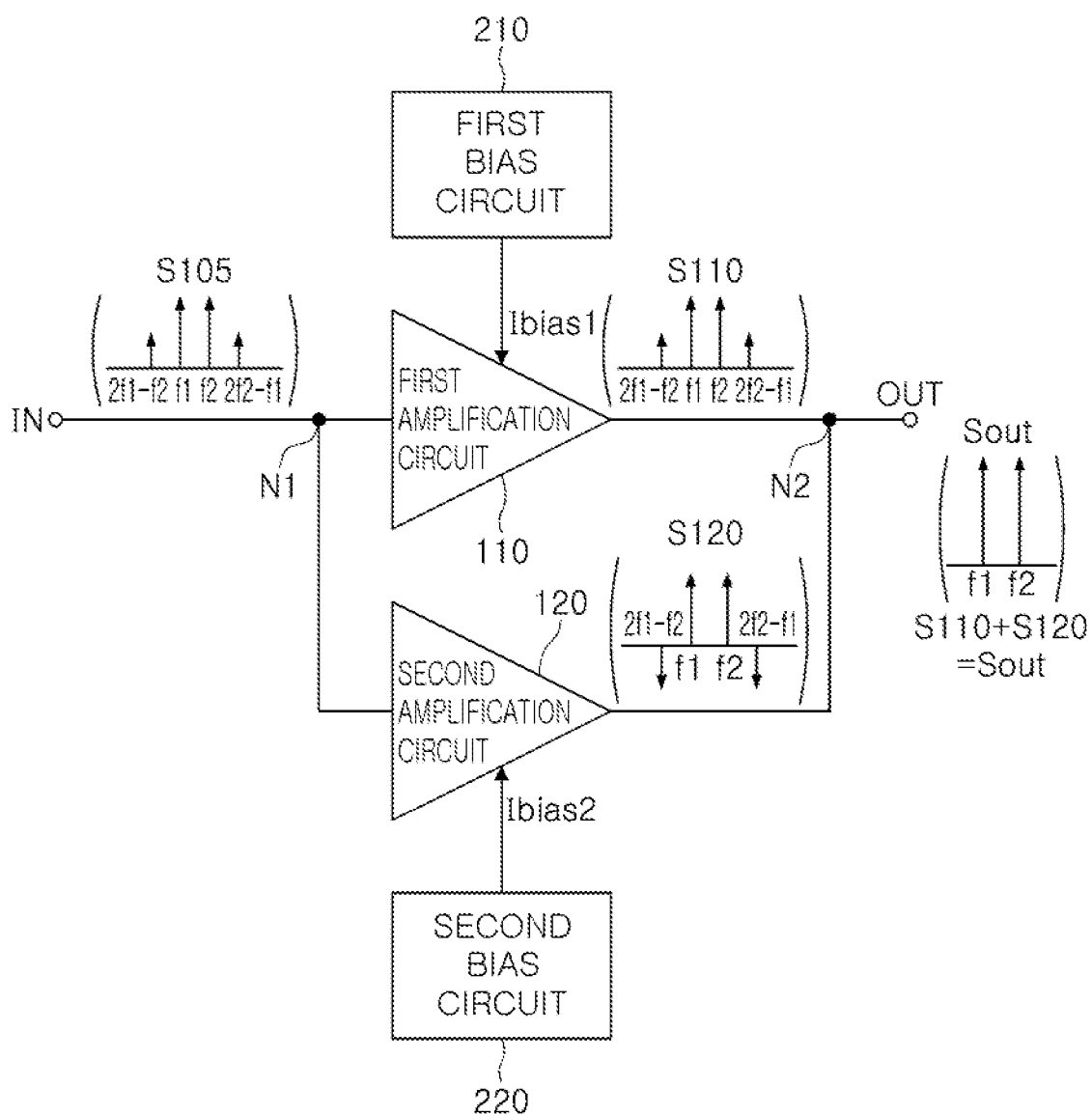
FIG. 1 is a view illustrating an example of a configuration of a power amplifying apparatus.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view illustrating an example of a configuration of a power amplifying apparatus.

Referring to FIG. 1, a power amplifying apparatus according to an example may include a first bias circuit 210, a first amplification circuit (or amplifier) 110, a second bias circuit 220, and a second amplification circuit (or amplifier) 120.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Figure 2:
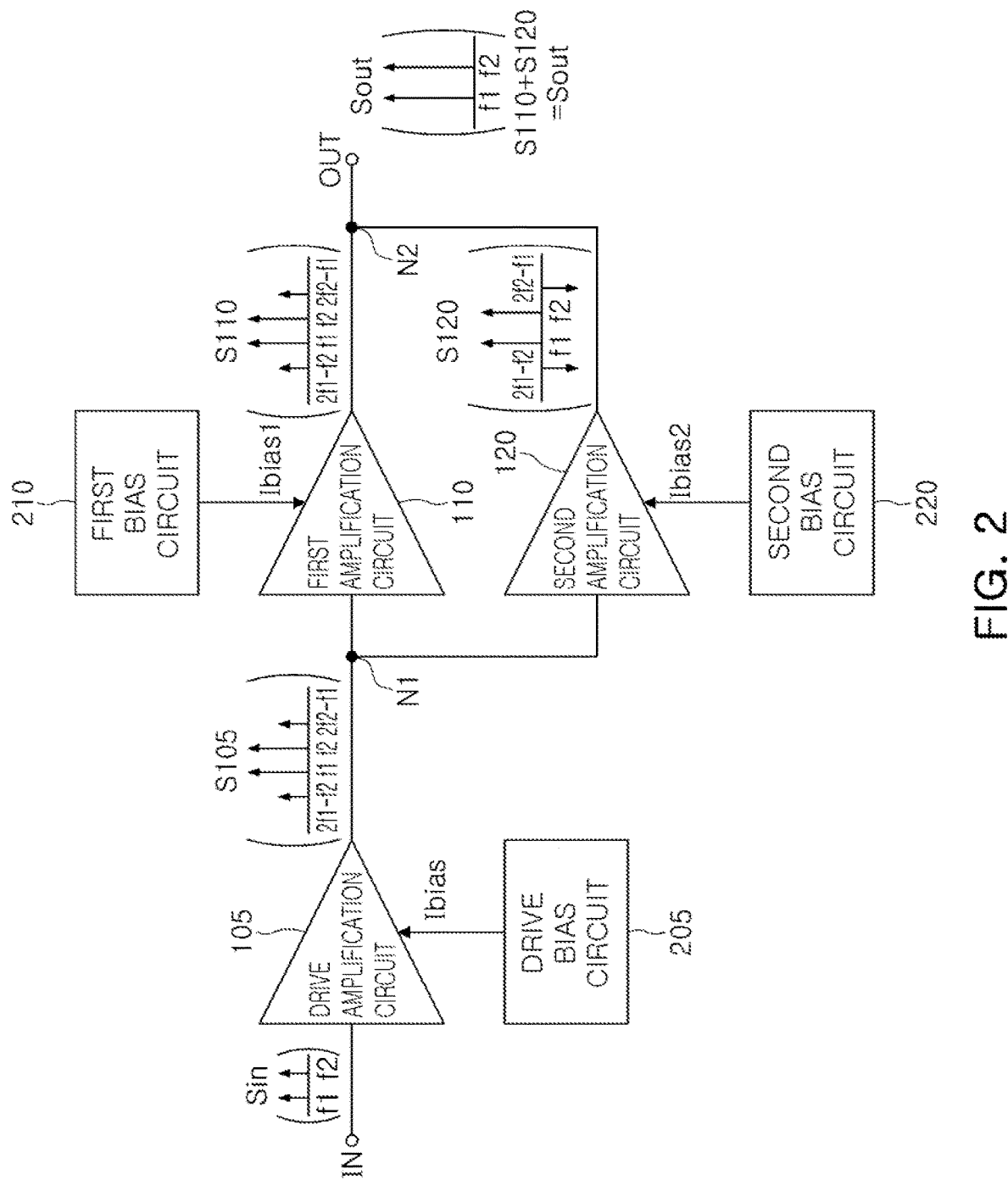
FIG. 2 is a view illustrating an example of a configuration of a power amplifying apparatus.

FIG. 2 is a view illustrating an example of another configuration of a power amplifying apparatus according to an example. Referring to FIG. 2, a power amplifying apparatus according to an example may include a drive bias circuit 205, a drive amplification circuit 105, the first bias circuit 210, the first amplification circuit 110, the second bias circuit 220, and the second amplification circuit 120.

Referring to FIG. 2, the drive bias circuit 205 may generate a drive bias current Ibias.

The drive amplification circuit 105 may be supplied with, or may receive, the drive bias current Ibias and amplify an input signal Sin of two tones having a first frequency component f1 and a second frequency component f2, and output an amplified signal S105. As an example, the amplified signal S105 may include IM3 components (2f1-f2, 2f2-f1) other than the amplified first frequency component f1 and the amplified second frequency component f2.

As an example, the first frequency component f1 and the second frequency component f2 may be Long Term Evolution (LTE) B1 high channel (fc:1979.5 MHz) two tone signals, and in this case, a tone spacing may be 1 MHz.

Referring to FIGS. 1 and 2, the first bias circuit 210 may generate a first bias current Ibias1.

The first amplification circuit 110 may be supplied with the first bias current Ibias1 and amplify a signal input through a first node N1 (or an input terminal IN, FIG. 1), which is an output node of the drive amplification circuit 105, and output a first amplified signal S110 to a second node N2. As an example, the first amplified signal S110 may include the amplified first frequency component f1, the amplified second frequency component f2, and the IM3 components (2f1-f2, 2f2-f1).

The second bias circuit 220 may generate a second bias current Ibias2 having a magnitude different from a magnitude of the first bias current Ibias1. As an example, the second bias current Ibias2 may have a magnitude that is smaller than a magnitude of the first bias current Ibias1. As another example, the second bias current Ibias2 may have a magnitude that is greater than a magnitude of the first bias current Ibias1.

For example, the first bias current Ibias1 may be a bias current of class AB, and the second bias current Ibias2 may be a bias current of deep class AB between class AB and class B.

The second amplification circuit 120 may be connected in parallel with the first amplification circuit 110 to be supplied with the second bias current Ibias2 and amplify a signal input through the first node N1 (or the input terminal IN, FIG. 1) to output a second amplified signal S120 to the second node N2. As an example, the second amplified signal S120 may include the amplified first frequency component f1 and the amplified second frequency component f2, and may also include IM3 components (2f1-f2, 2f2-f1) in which a phase is shifted.

In addition, the second amplification circuit 120 may output the second amplified signal S120 having a third-harmonic component having a phase that may offset or cancel the IM3 component included in the first amplified signal S110, according to the second bias current Ibias2. The shifted phase or the phase that may offset or cancel the IM3 component may be a phase between 150° and 180°, and may have a phase difference of 180° to increase a cancellation effect of the IM3 component.

Accordingly, at the second node N2, the first frequency component f1 and the second frequency component f2 from the first amplification circuit 110, and the first frequency component f1 and the second frequency component f2 from the second amplification circuit 120 are added to each other with the same phase as each other, such that the magnitudes of the first frequency component f1 and the second frequency component f2 may be increased.

On the other hand, at the second node N2, the IM3 components (2f1-f2, 2f2-f1) from the first amplification circuit 110 are offset with the IM3 components (2f1-f2, 2f2-f1) from the second amplification circuit with a shifted phase of approximately 180°, such that the magnitudes of the IM3 components (2f1-f2, 2f2-f1) may be decreased.

As described above, when the first amplification circuit 110 and the second amplification circuit 120 driven with different bias magnitudes have a specific difference of the bias magnitudes, the IM3 components generated from the respective outputs thereof may have a phase difference of 180°, thereby canceling the IM3 components. When the respective IM3 components generated from the first amplification circuit 110 and the second amplification circuit 120 have ideally and accurately the same magnitude as each other, and have a phase difference of 180°, a maximum cancellation effect may be achieved.

For example, in a case in which the respective bias magnitudes of the first amplification circuit and the second amplification circuit are different from each other, a concept in which the phases of the IM3 components output from the first amplification circuit 110 and the second amplification circuit 120 are shifted will be described. The reason is that in each amplification circuit, a third-order transconductance gm″ of a transistor associated with the IM3 may have a negative value or a positive value depending on a bias level. For example, when the transistor of the amplification circuit is biased, the third-order transconductance gm″ may have a positive value +gm″ in a case in which the transistor is in a weak inversion region, and the third-order transconductance gm″ may have a negative value −gm″ in a case in which the transistor is in a strong inversion region. On the other hand, a first-order transconductance associated with a fundamental frequency signal may always have a positive value regardless of the biased region.

In the respective drawings of this application, unnecessarily overlapped descriptions are possibly omitted for components having the same reference numeral and the same function, and differences in the respective drawings will be described.

Figure 3:
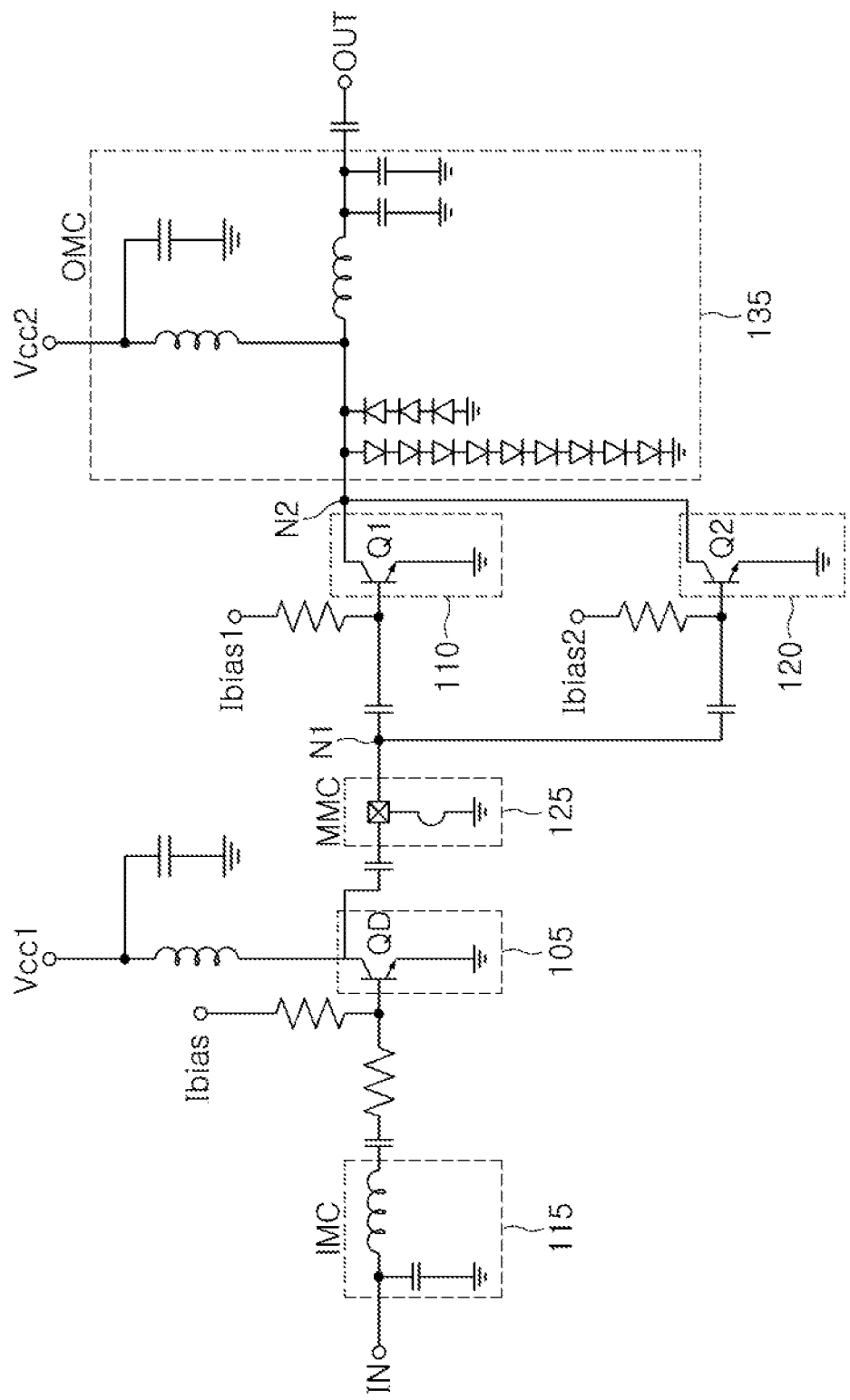
FIG. 3 is a view illustrating an example of an implementation of a power amplifying apparatus.

FIG. 3 is a view illustrating an example of an implementation of a power amplifying apparatus.

Referring to FIG. 3, the drive amplification circuit 105 may include a plurality of drive transistors QD having a base to which a drive bias current Ibias is supplied. The first amplification circuit 110 may include a plurality of first amplification transistors Q1 having a base to which a first bias current Ibias1 is supplied. The second amplification circuit 120 may include a plurality of second amplification transistors Q2 having a base to which a second bias current Ibias2 is supplied.

In addition, the power amplification circuit may include an input matching circuit (IMC) 115, an inter-stage matching circuit (MMC) 125, and an output matching circuit (OMC) 135.

The input matching circuit IMC 115 may include an inductor and a capacitor.

The inter-stage matching circuit MMC may include a wire inductor.

The output matching circuit OMC may include an inductor, a capacitor, and a diode circuit for discharge protection which is reversely connected.

A DC blocking capacitor may be connected between the above-mentioned circuits.

As an example, each of the drive transistor QD, the first amplification transistor Q1, and the second amplification transistor Q2 may be a hetero-junction bipolar transistor (HBT), but is not limited thereto.

Meanwhile, in relation to the IM3 cancellation, since the phase difference of the IM3 components between the first and second amplification circuits 110 and 120 is greatly changed depending on a frequency of an input signal, it may be difficult to optimize the phase difference of the IM3 components over a wideband. Therefore, in linearization over a wideband, there may be a limitation, and in view of such limitation, each example may improve the limitation by using a variable bias circuit.

For example, the magnitude of the second bias current of the second amplification circuit 120 may be adjusted according to the frequency of the signal by varying the second bias current according to the frequency of the input signal using the current variable circuit such as a current sink or a current source.

Accordingly, even in a case in which the frequency of the input signal is changed, since the phase difference of the IM3 components generated from the first and second amplification circuits 110 and 120 may be optimized, the IM3 cancellation effect over the wideband may be achieved.

As an example, in an example in which the second bias circuit is implemented as a current sink circuit or a current source circuit, since the bias current may be varied through a sinking or a sourcing, and such a current bias may be varied and supplied to the power amplifying apparatus, a frequency band in which linearity of the power amplifying apparatus is secured may be expanded.

Figure 4:
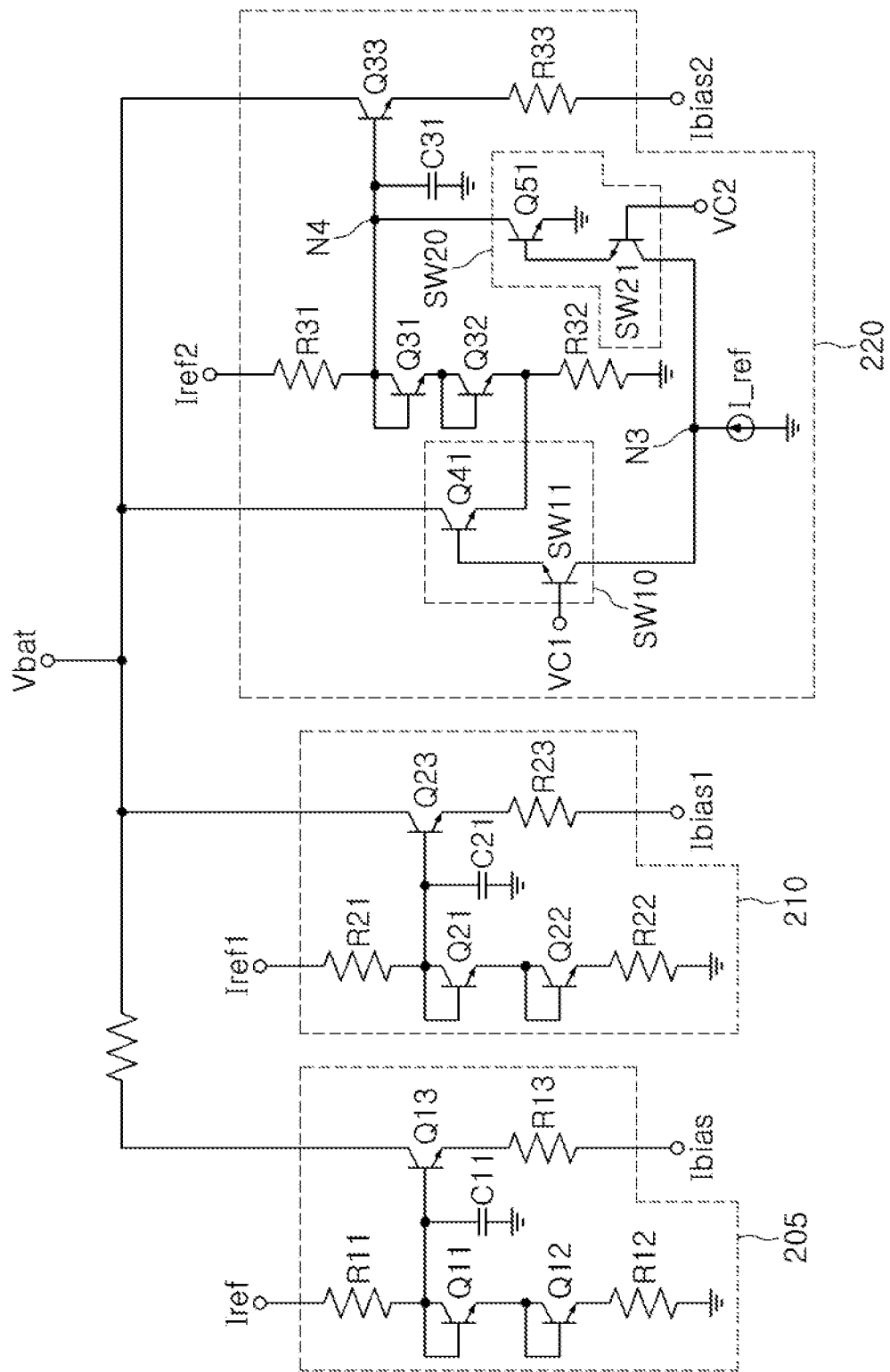
FIG. 4 is a view illustrating an example of an implementation of a bias circuit.

FIG. 4 is a view illustrating an example of an implementation of a bias circuit.

Referring to FIG. 4, as an example, the drive bias circuit 205 may include a resistor R11, transistors Q11 and Q12 connected to each other by a diode, and a resistor R12, which are connected in series with each other between a drive reference current Iref terminal and a ground. The drive bias circuit 205 may include an output transistor Q13 having a collector connected to a battery voltage Vbat terminal, a base connected to a connection node of the resistor R11 and the transistor Q11 connected by the diode, and an emitter connected to an output terminal through a resistor R13. The drive bias circuit 205 may further include a capacitor C11 connected to the base of the output transistor Q13. The drive bias circuit 205 illustrated in FIG. 4 is merely illustrated as an example and is not limited thereto.

As an example, the first bias circuit 210 may include a resistor R21, transistors Q21 and Q22 connected to each other by a diode, and a resistor R22, which are connected in series with each other between a first reference current Iref1 terminal and a ground. The first bias circuit 210 may include an output transistor Q23 having a collector connected to a battery voltage Vbat terminal, a base connected to a connection node of the resistor R21 and the transistor Q21 connected by the diode, and an emitter connected to an output terminal through the resistor R23. The first bias circuit 210 may further include a capacitor C21 connected to the base of the output transistor Q23. The first bias circuit 210 illustrated in FIG. 4 is merely illustrated as an example and is not limited thereto.

As an example, the second bias circuit 220 may include a resistor R31, transistors Q31 and Q32 connected to each other by a diode, and a resistor R32, which are connected in series with each other between a second reference current Iref2 terminal and a ground. The second bias circuit 220 may include an output transistor Q33 having a collector connected to a battery voltage Vbat terminal, a base connected to a connection node of the resistor R31 and the transistor Q31 connected by the diode, and an emitter connected to an output terminal through the resistor R33. The second bias circuit 220 may further include a capacitor C31 connected to the base of the output transistor Q33.

In an example, the second bias circuit 220 may further include a first switch circuit SW10 and a second switch circuit SW20.

As an example, the first switch circuit SW10 may include a first transistor Q41 and a first switch element SW11.

The first transistor Q41 may include a collector connected to the battery voltage Vbat terminal, an emitter connected to a connection node between the resistor R32 and the transistor Q32 connected by the diode, and a base connected to an emitter of the first switch element SW11. The first switch element SW11 may supply a reference current I_ref to the base of the first transistor Q41 in response to a first control signal VC1. When the first control signal VC1 is at an on-level, the first switch element SW11 may become an on-state, and the first transistor Q41 may operate according to the reference current I_ref supplied to the base of the first transistor through the first switch element SW11 and supply a source current to the resistor R32. In this case, the second switch circuit SW20 may become an off-state in response to a second control signal VC2.

As an example, the second switch circuit SW20 may include a second transistor Q51 and a second switch element SW21.

The second transistor Q51 may be connected between the base of the output transistor Q33 and the ground. The second switch element SW21 may supply a reference current I_ref to a base of the second transistor Q51 in response to a second control signal VC2. When the second control signal VC2 is at an on-level, the second switch element SW21 may become an on-state, and the second transistor Q51 may operate according to the reference current I_ref supplied to the base of the second transistor Q51 through the second switch element SW21 and bypass a sink current from the base of the output transistor Q33 to the ground. In this case, the first switch circuit SW10 may become an off-state in response to the first control signal VC1.

The second bias circuit 220 illustrated in FIG. 4 is merely illustrated as an example and is not limited thereto.

Figure 5:
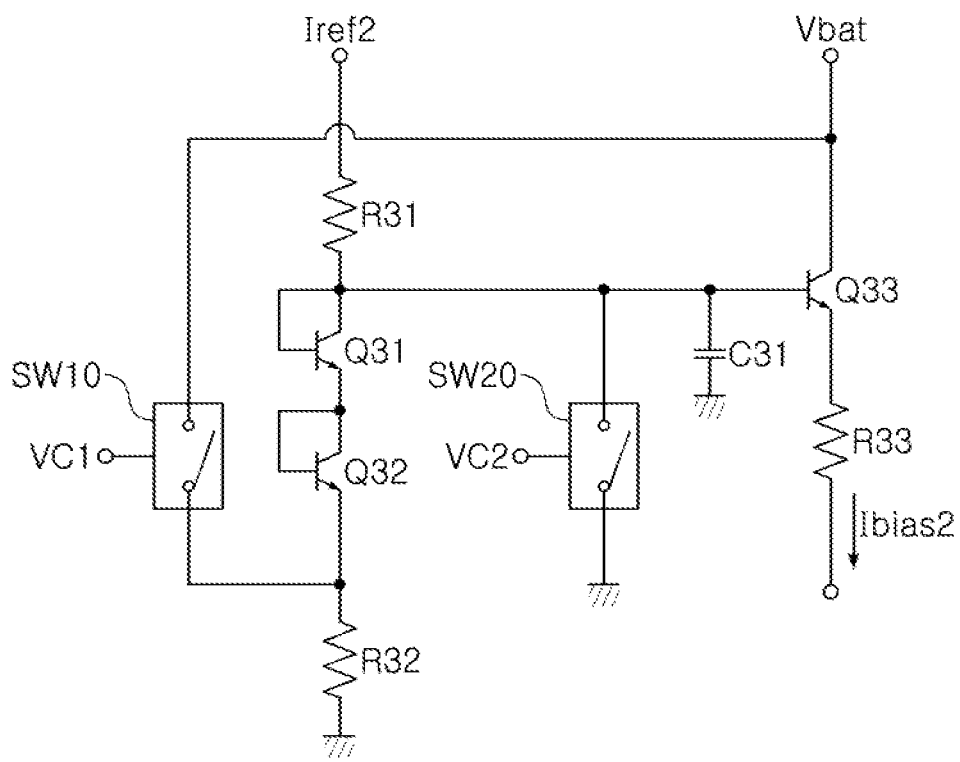
FIG. 5 is a view illustrating an example of a first operation of a second bias circuit of FIG. 4.

FIG. 5 is a view illustrating an example of a first operation of the second bias circuit 220 of FIG. 4.

Referring to FIG. 5, in an example in which both the first control signal VC1 and the second control signal VC2 are at an operation-off level, a first operation example of the second bias circuit 220 is illustrated in an example in which both the first switch circuit SW10 and the second switch circuit SW20 are in an operation-off state.

In FIG. 5, in the example in which both the first switch circuit SW10 and the second switch circuit SW20 are in the operation-off state, the second bias circuit 220 may supply the second bias current Ibias2.

As an example, the second bias circuit 220 may generate the second bias current Ibias2 having a magnitude corresponding to a magnitude of a fundamental frequency included in the input signal Sin.

Referring to FIG. 5, in the input signal having a first frequency component f1 and a second frequency component f2, in a state in which the first control signal VC1 and the second control signal VC2 are respectively applied to the first switch circuit SW10 and the second switch circuit SW20 with a low level such that both the first switch circuit SW10 and the second switch circuit SW20 are in the off-state, the circuit of FIG. 5 is designed so that two IM3 components from the first and second amplification circuits may have a phase difference of about 180° through the remaining current buffered bias circuits Q31, Q32, R31, C31, Q33, and R33 other than the first switch circuit SW10 and the second switch circuit SW20.

Accordingly, as described above, the first and second bias circuits may perform the IM3 cancellation in the input signal having the first frequency component f1 and the second frequency component f2.

As an example, in an example in which the first frequency component f1 and the second frequency component f2 of the input signal in the above-mentioned state are changed, since the phase difference of the two IM3 components generated from the first amplification circuit 110 (FIG. 2) and the second amplification circuit 120 (FIG. 2) deviates from 180°, the bias current should be varied to compensate for the deviated phase difference, and a current source circuit or a current sink circuit may be implemented to vary the bias current. This will be described with reference to FIGS. 6 and 7.

As another example, when the fundamental frequency included in the input signal Sin is varied, the second bias circuit 220 may vary the second bias current Ibias2 corresponding to the varied magnitude of the fundamental frequency. For example, the second bias circuit 220 may vary the second bias current Ibias2 through current sourcing or current sinking, according to an increase or a decrease of the fundamental frequency included in the input signal Sin.

Figure 6:
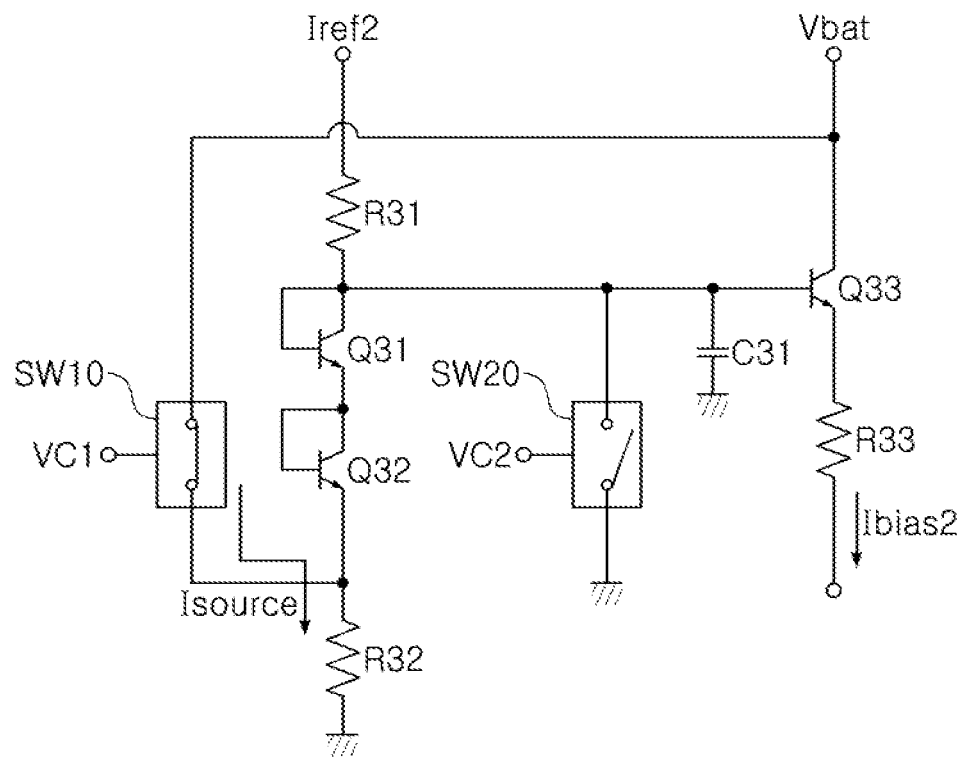
FIG. 6 is a view illustrating an example of a second operation of a second bias circuit of FIG. 4.

FIG. 6 is a view illustrating an example of a second operation of the second bias circuit 220 of FIG. 4.

Referring to FIG. 6, in an example in which the first control signal VC1 is at an operation-on level and the second control signal VC2 is at an operation-off level, a second operation example of the second bias circuit 220 is illustrated in an example in which the first switch circuit SW10 is in an operation-on state and the second switch circuit SW20 is in an operation-off state.

In FIG. 6, in a state in which the first switch circuit SW10 is in an operation-on state and the second switch circuit SW20 is in an operation-off state, the second bias circuit 220 may supply the second bias current Ibias2 increased as a voltage applied to a base of the output transistor Q33 is increased by a source current which is additionally supplied to the resistor R32 by the first switch circuit SW10.

For example, in a case in which the first component f1 and the second frequency component f2 are increased, in a situation in which the bias magnitude of the second amplification circuit should be increased as compared to the signal having the previous two frequency components in order to optimize the phase difference of the IM3 components, the first control signal VC1 may be applied to the first switch circuit with a high level and the second control signal VC2 may be applied to the second switch circuit with a low level as described above, such that the source current may be supplied to the resistor R32 as described above by using the first switch circuit. Accordingly, the bias magnitude may be increased.

Figure 7:
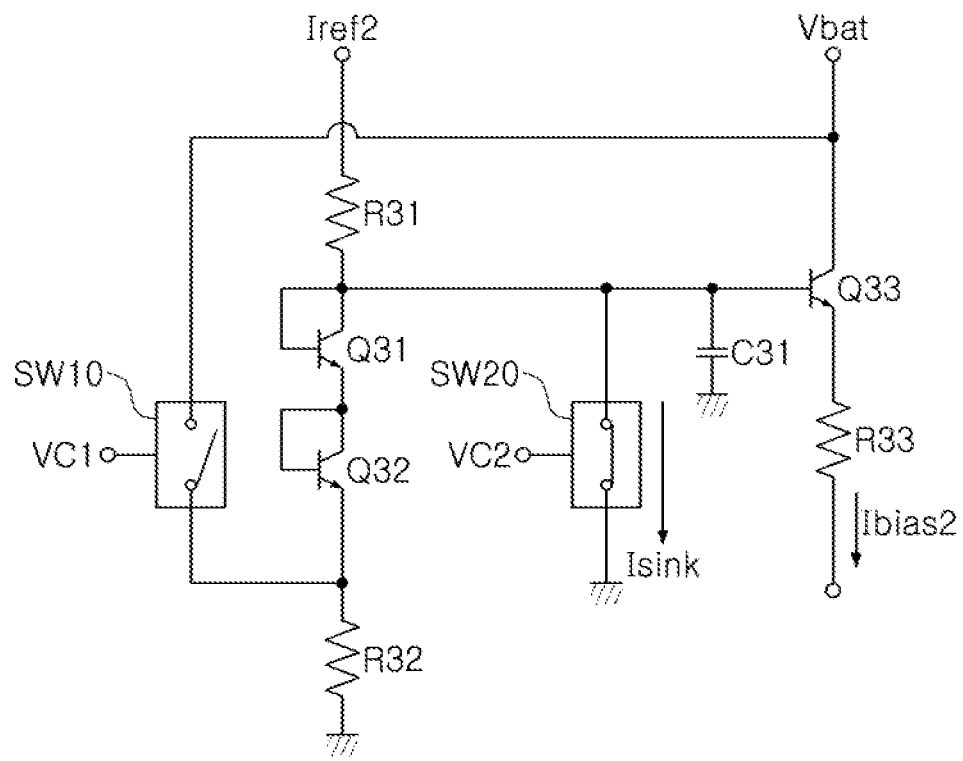
FIG. 7 is a view illustrating an example of a third operation of a second bias circuit of FIG. 4.

FIG. 7 is a view illustrating an example of a third operation of the second bias circuit 220 of FIG. 4.

Referring to FIG. 7, in an example in which the first control signal VC1 is at an operation-off level and the second control signal VC2 is at an operation-on level, a third operation example of the second bias circuit 220 is illustrated in an example in which the first switch circuit SW10 is at an operation-off state and the second switch circuit SW20 is at an operation-on state.

In FIG. 7, in a state in which the first switch circuit SW10 is at an operation-off state and the second switch circuit SW20 is at an operation-on state, since the sink current is bypassed from the base of the output transistor Q33 to the ground by the second switch circuit SW20, the second bias circuit 220 may supply the second bias current Ibias2 decreased as a voltage applied to the base of the output transistor Q33 is decreased.

For example, in a case in which the first component f1 and the second frequency component f2 are decreased, in an example in which the bias magnitude of the second amplification circuit should be decreased as compared to the signal having the previous two frequency components in order to optimize the phase difference of the IM3 components, the first control signal VC1 is applied to the first switch circuit with a low level and the second control signal VC2 is applied to the second switch circuit with a high level as described above, such that the sink current may be bypassed to the ground as described above by using the second switch circuit. Accordingly, as described above, the magnitude of the second bias current may be decreased.

With an operation principle as described above, the bias magnitude of the second amplification circuit may be adjusted over a wide frequency band to implement an IM3 phase optimization of the first and second amplification circuits, thereby achieving a wideband linearity effect.

Figure 8:
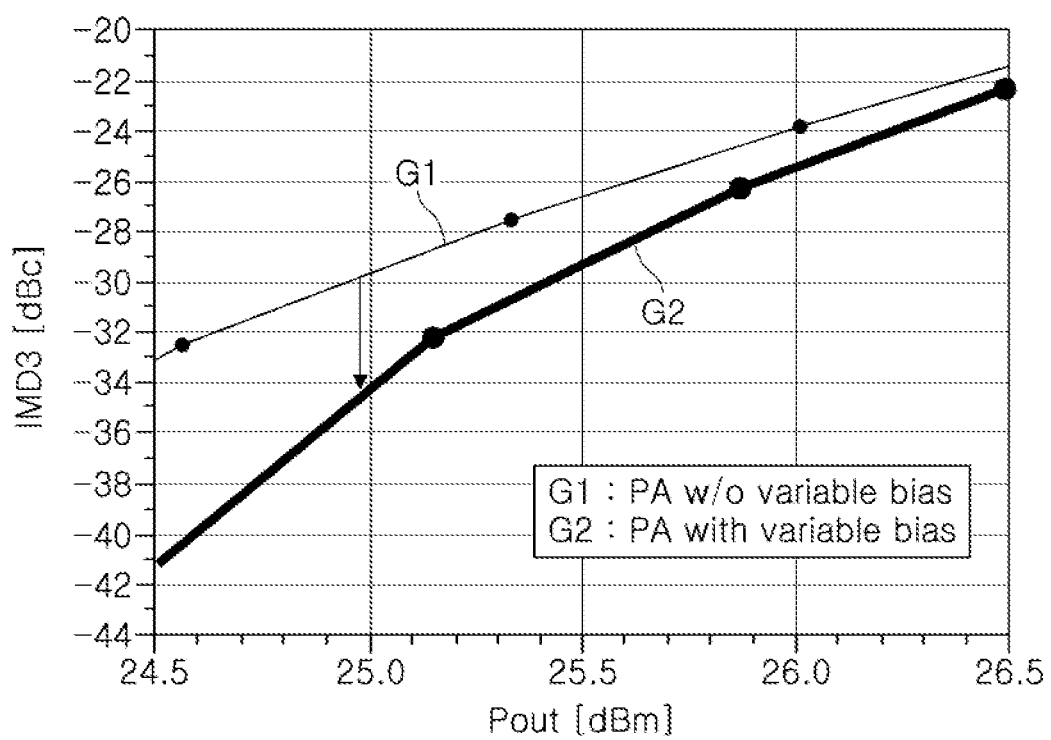
FIG. 8 illustrates an example of a characteristic graph of IMD3-Pout based on whether or not a variable bias is used.

FIG. 8 is a characteristic graph of IMD3-Pout depending on whether or not a variable bias is used.

In FIG. 8, G1 is a characteristic graph of IMD3-Pout for a case in which a variable bias is not used and G2 is a characteristic graph of IMD3-Pout for a case in which the variable bias is used. G1 and G2 are results of a simulation in which an LTE B1 high channel (fc:1979.5 MHz) two tone signal is input with a tone spacing of 1 MHz, and are graphs illustrating the respective IMD3 and output power Pout conducted to an output load resistor.

Referring to G1 and G2 of FIG. 8, it may be seen that the case in which the variable bias is used has an effect in which IMD3 is improved by about 4 dB at a target power of 25 dBm as compared to the case in which the variable bias is not used.

As set forth above, according to an example, when a two-tone signal including two different frequency components is used, IMD3 and linearity may be improved over a wideband.

An IM3 cancellation effect may be implemented by adjusting components of IM3 currents generated by the respective cells to have a phase difference of 180° by using a variable bias circuit which may be varied, regardless of a frequency of an input signal.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A power amplifying apparatus comprising:
a first bias circuit configured to generate a first bias current;
a first amplification circuit configured to receive the first bias current from the first bias circuit and an input signal input through a first node, amplify the input signal, and output a first amplified signal to a second node;
a second bias circuit configured to generate a second bias current having a magnitude different from a magnitude of the first bias current; and
a second amplification circuit connected in parallel with the first amplification circuit and configured to receive the second bias current from the second bias circuit and the input signal input through the first node, amplify the input signal, and output a second amplified signal to the second node, wherein the second amplification circuit is further configured so that the second bias current causes the second amplified signal to comprise a third-order intermodulation distortion (IM3) component having a phase offsetting a third-order intermodulation distortion (IM3) component included in the first amplified signal.

2. The power amplifying apparatus of claim 1, wherein the magnitude of the second bias current is less than the magnitude of the first bias current.

3. The power amplifying apparatus of claim 1, wherein the magnitude of the second bias current is greater than the magnitude of the first bias current.

4. The power amplifying apparatus of claim 1, wherein the first bias current is a bias current of class AB, and
the second bias current is a bias current of deep class AB between class AB and class B.

5. The power amplifying apparatus of claim 1, wherein the magnitude of the second bias current corresponds to a fundamental frequency included in the input signal.

6. The power amplifying apparatus of claim 1, wherein the second bias circuit is further configured to vary the second bias current through current sourcing or current sinking according to an increase or a decrease of a fundamental frequency included in the input signal.

7. The power amplifying apparatus of claim 1, wherein the second bias circuit is further configured to vary the second bias current in response to a variation of a fundamental frequency included in the input signal.

8. The power amplifying apparatus of claim 1, wherein the second bias circuit is a variable bias circuit.

9. A power amplifying apparatus comprising:
a drive bias circuit configured to generate a drive bias current;
a drive amplification circuit configured to receive the drive bias current, amplify an input signal comprising a first frequency component and a second frequency component, and output an amplified signal to a first node;
a first bias circuit configured to generate a first bias current;
a first amplification circuit configured to receive the first bias current from the first bias circuit and the amplified signal from the first node, amplify the amplified signal received from the first node, and output a first amplified signal to a second node;
a second bias circuit configured to generate a second bias current having a magnitude different from a magnitude of the first bias current; and
a second amplification circuit connected in parallel with the first amplification circuit and configured to receive the second bias current from the second bias circuit and the amplified signal from the first node, amplify the amplified signal received from the first node, and output a second amplified signal to the second node,
wherein the second amplification circuit is further configured so that the second bias current causes the second amplified signal to comprise a third-order intermodulation distortion (IM3) component having a phase offsetting a third-order intermodulation distortion (IM3) component included in the first amplified signal.

10. The power amplifying apparatus of claim 9, wherein the magnitude of the second bias current is less than the magnitude of the first bias current.

11. The power amplifying apparatus of claim 9, wherein the magnitude of the second bias current is greater than the magnitude of the first bias current.

12. The power amplifying apparatus of claim 9, wherein the first bias current is a bias current of class AB, and
the second bias current is a bias current of deep class AB between class AB and class B.

13. The power amplifying apparatus of claim 9, wherein the magnitude of the second bias current corresponds to a fundamental frequency included in the input signal.

14. The power amplifying apparatus of claim 9, wherein the second bias circuit is further configured to vary the second bias current through current sourcing or current sinking according to an increase or a decrease of a fundamental frequency included in the input signal.

15. The power amplifying apparatus of claim 9, wherein the second bias circuit is further configured to vary the second bias current in response to a variation of a fundamental frequency included in the input signal.

16. The power amplifying apparatus of claim 9, wherein the second bias circuit is a variable bias circuit.

17. A power amplifying apparatus comprising:
a first amplifier configured to receive a first bias current and an input signal comprising two frequency components, and generate a first amplified signal based on the first bias current and the input signal;
a variable bias circuit configured to generate a second bias current; and
a second amplifier connected in parallel with the first amplifier and configured to receive the second bias current and the input signal, and generate a second amplified signal based on the second bias current and the input signal,
wherein the second amplified signal comprises a third-order intermodulation distortion (IM3) component having a phase that offsets a third-order intermodulation distortion (IM3) component included in the first amplified signal, and
the second amplification circuit is further configured so that the second bias current causes the second amplified signal to comprise the third-order intermodulation distortion (IM3) component having the phase offsetting the third-order intermodulation distortion (IM3) component included in the first amplified signal.

18. The power amplifying apparatus of claim 17, wherein the variable bias circuit is further configured to adjust a magnitude of the second bias current based on a fundamental frequency included in the input signal.

19. The power amplifying apparatus of claim 17, wherein the variable bias circuit comprises:
a current sink circuit configured to decrease the second bias current in response to a decrease in a fundamental frequency included in the input signal; and
a current source circuit configured to increase the second bias current in response to an increase in the fundamental frequency included in the input signal.

* * * * *